(12) United States Patent
Kanagawa et al.

(10) Patent No.: US 10,777,703 B2
(45) Date of Patent: Sep. 15, 2020

(54) METHOD OF MANUFACTURING PATTERNED SUBSTRATE AND METHOD OF MANUFACTURING SEMICONDUCTOR DEVICE USING THE SAME

(71) Applicant: NICHIA CORPORATION, Anan-shi, Tokushima (JP)

(72) Inventors: Yuki Kanagawa, Komatsushima (JP); Kei Murakami, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 87 days.

(21) Appl. No.: 16/020,663

(22) Filed: Jun. 27, 2018

(65) Prior Publication Data

US 2019/0006552 A1 Jan. 3, 2019

(30) Foreign Application Priority Data

Jun. 30, 2017 (JP) .................................. 2017-129678

(51) Int. Cl.
*H01L 33/00* (2010.01)
*H01L 21/033* (2006.01)
(Continued)

(52) U.S. Cl.
CPC .............. *H01L 33/007* (2013.01); *G03F 1/50* (2013.01); *G03F 7/70475* (2013.01);
(Continued)

(58) Field of Classification Search
CPC ... H01L 33/007; H01L 21/0332; H01L 33/36; H01L 21/0337; H01L 33/0075;
(Continued)

(56) References Cited

U.S. PATENT DOCUMENTS

| 2010/0059789 A1* | 3/2010 | Choi | ................... H01L 21/0242 257/103 |
| 2010/0239833 A9* | 9/2010 | Jackman | ................ B82Y 10/00 428/220 |

(Continued)

FOREIGN PATENT DOCUMENTS

| JP | 2007-097015 A | 4/2007 |
| JP | 2011-227188 A | 11/2011 |
| JP | 2012-064902 A | 3/2012 |

*Primary Examiner* — Stephen W Smoot
*Assistant Examiner* — Vicki B. Booker
(74) *Attorney, Agent, or Firm* — Foley & Lardner LLP

(57) ABSTRACT

A method of manufacturing a patterned substrate includes: providing an exposure mask that includes: a plurality of inner light-shielding portions arranged in a lattice, a light-transmissive portion integrally connecting regions surrounding the plurality of inner light-shielding portions, and an outer light-shielding portion surrounding the light-transmissive portion; performing a plurality of exposures of a photoresist layer disposed on a substrate in a step-and-repeat-manner using the exposure mask, so as to form a plurality of inner projected parts corresponding to the inner light-shielding portions, the inner projected parts being aligned in a lattice as a whole; developing the photoresist layer on which the plurality of exposures have been performed; and etching the substrate using the developed photoresist layer as a mask.

20 Claims, 18 Drawing Sheets

(51) Int. Cl.
*H01L 33/36* (2010.01)
*G03F 1/50* (2012.01)
*G03F 7/20* (2006.01)
*G03F 1/54* (2012.01)

(52) U.S. Cl.
CPC ...... *H01L 21/0332* (2013.01); *H01L 21/0337* (2013.01); *H01L 33/36* (2013.01); *G03F 1/54* (2013.01)

(58) Field of Classification Search
CPC ..... H01L 21/027; G03F 7/70475; G03F 1/50; G03F 1/54; G03F 7/2022; G03F 1/00
See application file for complete search history.

(56) References Cited

U.S. PATENT DOCUMENTS

| | | | |
|---|---|---|---|
| 2011/0177462 A1* | 7/2011 | Hatakeyama | G03F 7/0397 430/325 |
| 2013/0175568 A1* | 7/2013 | Uenishi | H01L 33/007 257/98 |
| 2019/0339611 A1* | 11/2019 | Zhang | G03F 1/90 |

* cited by examiner

METHOD OF MANUFACTURING PATTERNED SUBSTRATE AND METHOD OF MANUFACTURING SEMICONDUCTOR DEVICE USING THE SAME

CROSS-REFERENCE TO RELATED PATENT APPLICATIONS

This application claims priority to Japanese Patent Application No. 2017-129678 filed on Jun. 30, 2017. The entire disclosure of Japanese Patent Application No. 2017-129678 is hereby incorporated herein by reference.

BACKGROUND

The present disclosure relates to a method of manufacturing a patterned substrate and a method of manufacturing a semiconductor device using the same.

Semiconductor light emitting elements are widely used for light sources of various kinds of lighting devices. A semiconductor light emitting element includes a substrate and a semiconductor layer epitaxially-grown on the substrate.

Light generated in the semiconductor layer is emitted from a substrate-side or from the semiconductor layer located opposite to the substrate-side.

In the case in which the semiconductor light emitting element is a gallium nitride-based semiconductor element, the semiconductor layer has a high refractive index. Accordingly, total reflection tends to occur due to a high difference between a refractive index of the semiconductor layer and a refractive index of the air or the like surrounding the semiconductor light emitting element, so that light is less easily extracted to an outside of the semiconductor light emitting element. Therefore, the semiconductor light emitting element including such a semiconductor light emitting layer has room for improvement in light extraction efficiency.

As a method for improving light extraction efficiency, a technique is known in which a plurality of protruding portions (which may be referred to as "irregularities" in some documents) are formed at a surface of a substrate on which a semiconductor layer is to be epitaxially grown to scatter light emitted from the semiconductor layer on the surface of the substrate, which allows light at an incident angle smaller than the critical angle of total reflection to be emitted toward the outside. For example, such a sapphire substrate with a plurality of protruding portions is called as a "Patterned Sapphire Substrate (PSS)". JP 2012-64902 describes an example of a method of manufacturing a semiconductor substrate in which distortion of a pattern of irregularities is reduced.

SUMMARY

A substrate with a plurality of protruding portions can be used for a photonic device, an anti-reflection structure, or a diffusion structure in various fields, besides manufacturing of a light emitting element. The present disclosure provides a method of manufacturing a patterned substrate in which distortion of a pattern of the plurality of protruding portions is reduced, and a method of manufacturing a semiconductor device.

According to one embodiment, a method of manufacturing a patterned substrate includes: providing an exposure mask, the exposure mask comprising: a plurality of inner light-shielding portions arranged in a lattice, a light-transmissive portion integrally connecting regions surrounding the plurality of inner light-shielding portions, and an outer light-shielding portion surrounding the light-transmissive portion; exposing a photoresist layer disposed on a substrate a plurality of times in a step-and-repeat-manner using the exposure mask, such that inner projected parts that are projections of the inner light-shielding portions are aligned in a lattice (pattern) as a whole; developing the exposed photoresist layer; and etching the substrate using the developed photoresist layer as a mask. In the step of exposing, the photoresist layer is exposed a plurality of times such that a region corresponding to the light-transmissive portion formed by a predetermined exposure and a region corresponding to the light-transmissive portion formed by another exposure do not overlap each other on shortest straight lines connecting outermost inner projected parts of the predetermined exposure and respective ones of inner projected parts of another exposure that are located closest to the outermost inner projected parts of the predetermined exposure, while portions of the region corresponding to the light-transmissive portion formed by the predetermined exposure and portions of the region corresponding to the light-transmissive portion formed by the another exposure overlap each other, in places other than the shortest straight lines.

According to certain embodiments of the present disclosure, a patterned substrate can be manufactured in which distortion of a pattern of a plurality of protruding portions is reduced.

DETAILED DESCRIPTION

Figure 1A:
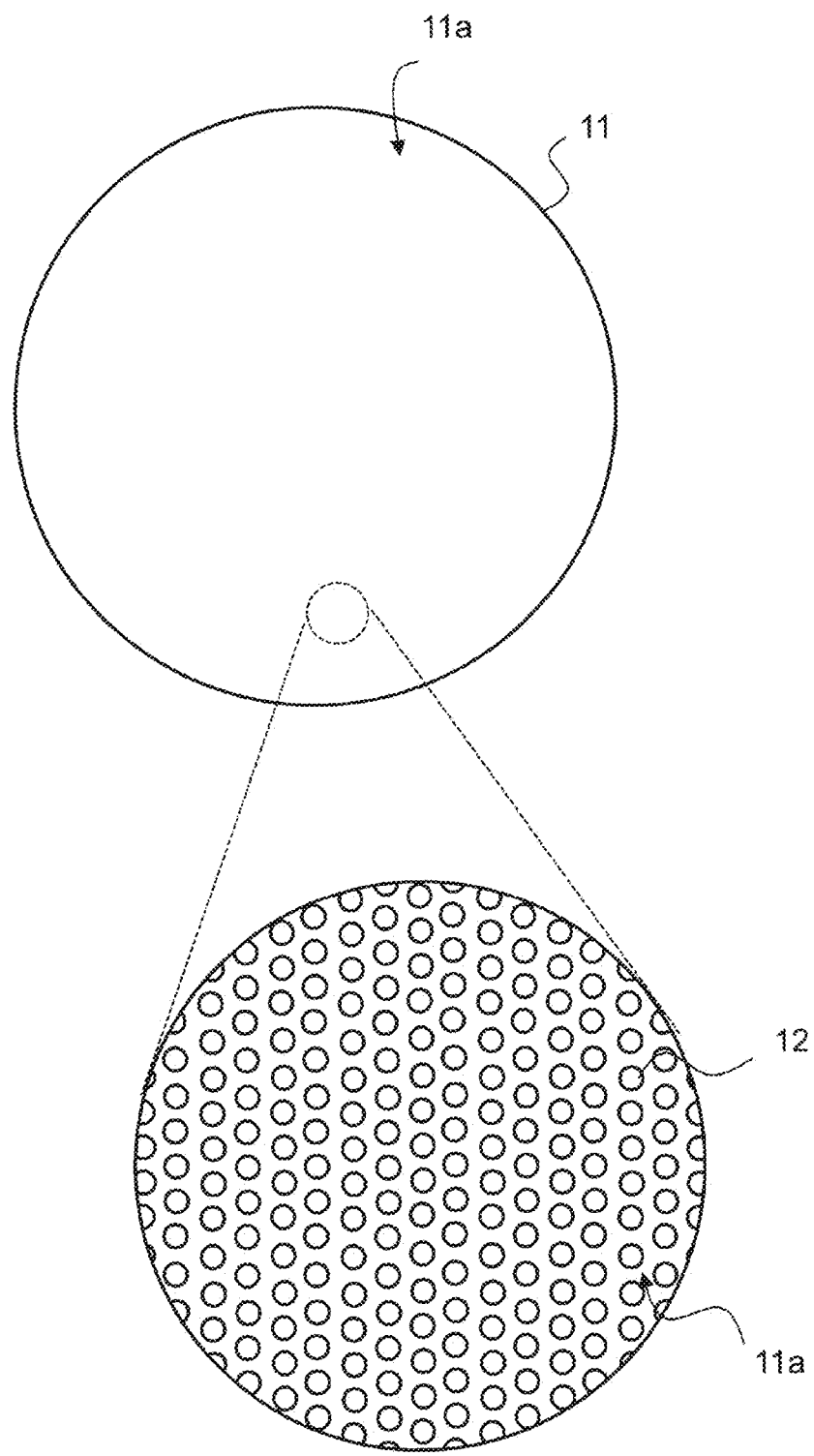
FIG. 1A is a schematic plan view of a patterned substrate according to the present disclosure and an enlarged plan view of a portion of the patterned substrate.

Certain embodiments of a method of manufacturing a patterned substrate and certain embodiments of a method of manufacturing a semiconductor device according to the present disclosure will be described below with reference to the drawings. A method of manufacturing a patterned substrate and a method of manufacturing a semiconductor device described below are examples, and various modifications can be made therein. In the description below, the same designations or the same reference numerals denote the same or like members, and detailed descriptions thereof will be appropriately omitted. In addition, a plurality of structural elements may be configured as a single part that serves the purpose of a plurality of elements, and on the other hand, a single structural element may be configured as a plurality of parts that serve the purpose of a single element. Further, two or more steps may be performed together, or a single step may be performed in two or more steps.

First Embodiment

A first embodiment of a method of manufacturing a patterned substrate according to the present disclosure will be described below.

A method of manufacturing a patterned substrate according to certain embodiments of the present disclosure allows for reducing distortion of a pattern of a photoresist layer for forming a plurality of protruding portions of a patterned substrate, so that a patterned substrate can be provided in which distortion of a pattern of the plurality of protruding portions is reduced. That is, exposure of a photoresist layer in a method of manufacturing a patterned substrate of the present disclosure allows realizing reduction in distortion of the pattern of the protruding portions. In the description below, a method of manufacturing a patterned substrate will be schematically explained, and then a method of exposing will be explained.

Structure of Patterned Substrate 11

Figure 1B:
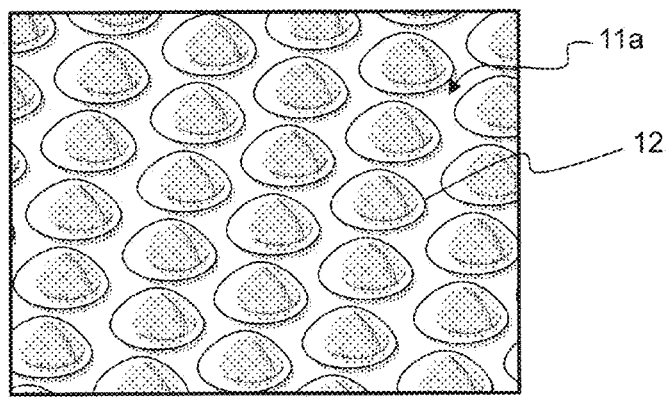
FIG. 1B is a schematic enlarged view of a shape of an upper surface of the patterned substrate shown in FIG. 1A.

FIG. 1A is a schematic plan view of a patterned substrate 11 according to the first embodiment of the present disclosure and an enlarged plan view of a portion of the patterned substrate 11. The patterned substrate 11 includes an upper surface 11a and a plurality of protruding portions 12 on the upper surface 11a. In the first embodiment, each of the protruding portions 12 has a bottom surface having a circular shape. FIG. 1B is a schematic enlarged perspective view of a portion of the upper surface 11a of the patterned substrate 11. In the first embodiment, each of the protruding portions 12 has a substantially conical shape. A surface (more specifically, a lateral surface) of each of the protruding portions 12 is preferably inclined with respect to the upper surface 11a. This allows for greatly changing angle of light emitted from a light emitting layer of a semiconductor element toward the patterned substrate 11. The bottom surface of each of the protruding portions 12 is not limited to a circular shape, but may be a polygonal shape or the like. In accordance with the use or design, the protruding portions 12 may be arranged on a portion of the upper surface 11a, or may be arranged on an entirety of the upper surface 11a.

Figure 1C:
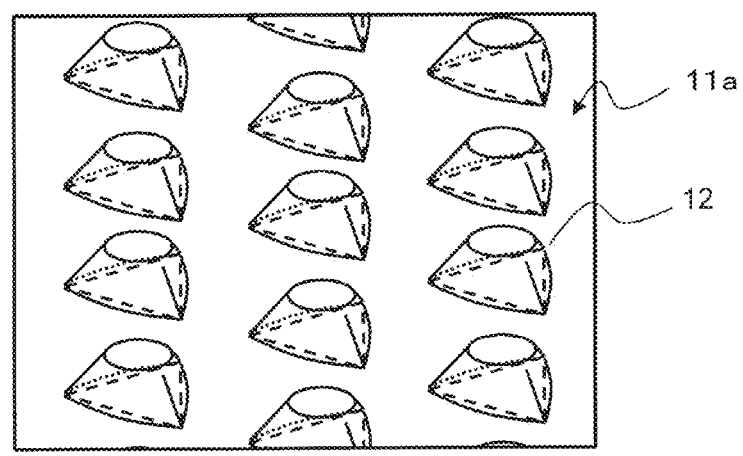
FIG. 1C is a schematic enlarged view of another shape of an upper surface of the patterned substrate according to the present disclosure.

FIG. 1C shows an example of another shape of the protruding portions 12. Each of the protruding portions 12 as shown in FIG. 1C has a frustum shape. The frustum shape has a bottom surface having a substantially triangular shape in which each side of a triangle (indicated by thick broken lines in FIG. 1C) is outwardly curved, and an upper surface with a substantially circular shape.

As will be described below, a shape of the protruding portions 12 depends on a shape of an etching mask for forming the protruding portions 12, a kind of etching, conditions of etching, etc. Hereinafter, in the present embodiment, a method of manufacturing a patterned substrate will be explained with reference to the patterned substrate 11 in which the bottom surface of each of the protruding portions 12 has a substantially circular shape.

The plurality of protruding portions 12 are two-dimensionally arranged on the upper surface 11a of the patterned substrate 11. The protruding portions 12 may be arranged randomly or regularly on the upper surface 11a. With a regular arrangement of the plurality of protruding portions 12, density of the protruding portions 12 on the upper surface 11a can be increased, and thus the direction in which light emitted from the light emitting layer and incident on the patterned substrate 11 is reflected can be varied more randomly.

In the case in which the plurality of protruding portions 12 are arranged regularly, the protruding portions 12 are arranged in a lattice. Examples of the arrangement in a lattice include an arrangement in a triangular lattice and an arrangement in a quadrangular lattice. In the case in which the bottom surface of each of the protruding portions 12 has a circular shape, an arrangement of the protruding portions 12 in a triangular lattice allows for a further increasing in the density of the protruding portions 12. The protruding portions 12 may also be arranged in a quadrangular lattice.

The patterned substrate 11 may be a substrate for which various kinds of materials are used in accordance with to the use. When the patterned substrate 11 is used for manufacturing a gallium-nitride based semiconductor light emitting element, examples of the patterned substrate 11 include a sapphire substrate. Further, a size of the patterned substrate 11 can be appropriately selected. A size of the bottom surface of each of the protruding portions 12, intervals between adjacent ones of protruding portions 12, and a height of the protruding portions 12 can be selected in accordance of the use and a desired design of the patterned substrate 11. In the case in which the patterned substrate 11 is used for a gallium-nitride based light emitting diode, the bottom surface of each of the protruding portions 12 has, for example, a circular shape with a diameter in a range of 0.3 μm to 5 μm. Further, intervals between adjacent ones of the protruding portions 12 is, for example, in a range of 0.4 μm to 6 μm. The protruding portions 12 have a height of, for example, in a range of 0.1 μm to 3 μm.

Overview of Method of Manufacturing Patterned Substrate 11

Next, with reference to FIG. 2A to FIG. 2E, a method of manufacturing the patterned substrate 11 will be described. FIG. 2A to FIG. 2E are schematic cross-sectional views illustrating a step in the method of manufacturing the patterned substrate 11.

Providing Exposure Mask

An exposure mask, having a pattern that corresponds to the protruding portions 12 to be formed on the upper surface 11a of the patterned substrate 11, is provided. This step will be described below in detail.

Exposing

Figure 2A:
FIG. 2A is a schematic cross-sectional view illustrating a step in a method of manufacturing a patterned substrate according to the present disclosure.
Figure 2B:
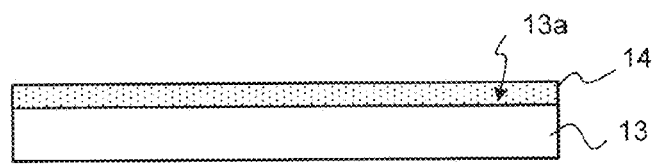
FIG. 2B is a schematic cross-sectional view illustrating a step in the method of manufacturing a patterned substrate according to the present disclosure.

As shown in FIG. 2A, a substrate 13 is provided. For example, in the case in which the patterned substrate 11 is used for manufacturing a gallium-nitride based semiconductor light emitting element, a sapphire substrate can be provided. A photoresist is applied on an upper surface 13a of the substrate 13, and a heat treatment (i.e., pre-baking) is performed, to form a photoresist layer 14 on the upper surface 13a of the substrate 13, as shown in FIG. 2B. Next, with the use of an exposure mask, the photoresist layer 14 is exposed. Details of the step of exposing will be described below. As needed, after the exposing, the photoresist layer 14 is subject to a heat treatment (i.e., post-baking).

Developing

Figure 2C:
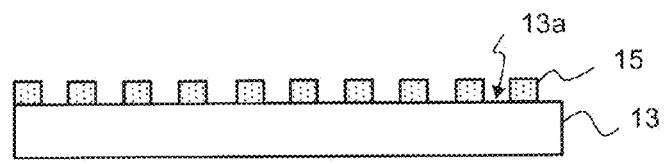
FIG. 2C is a schematic cross-sectional view illustrating a step in the method of manufacturing a patterned substrate according to the present disclosure.

The exposed photoresist layer 14 is brought into contact with a developing solution to develop the photoresist layer 14. In this step, a portion of the photoresist layer 14 subjected to exposure is dissolved to be developed as shown in FIG. 2C, so that a photoresist layer 15 having a predetermined pattern can be obtained.

Etching

Figure 2D:
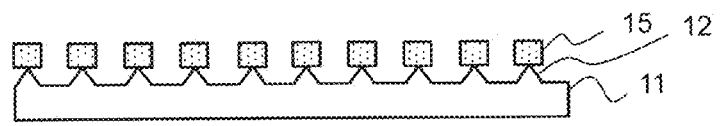
FIG. 2D is a schematic cross-sectional view illustrating a step in the method of manufacturing a patterned substrate according to the present disclosure.

The substrate 13 is etched from the upper surface 13a using the developed photoresist layer 15 as a mask. For the etching, dry-etching or wet-etching may be employed. In the case in which dry-etching is employed, appropriate selection of etching conditions, such as a gas to be used and a bias voltage, allow for adjusting outer shapes of the protruding portions 12. Accordingly, as shown in FIG. 2D, the patterned substrate 11 can be obtained in which each of the protruding portions 12 is located below a corresponding portion of the pattern of the developed photoresist layer 15.

Removing

Figure 2E:
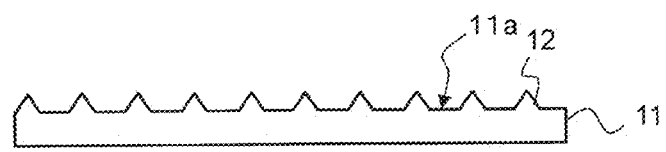
FIG. 2E is a schematic cross-sectional view illustrating a step in the method of manufacturing a patterned substrate according to the present disclosure.

By removing the photoresist layer 15, the patterned substrate 11 is completed in which the plurality of protruding portions 12 are formed on the upper surface 11a as shown in FIG. 2E.

Details of Providing Exposure Mask and Exposing

Figure 3A:
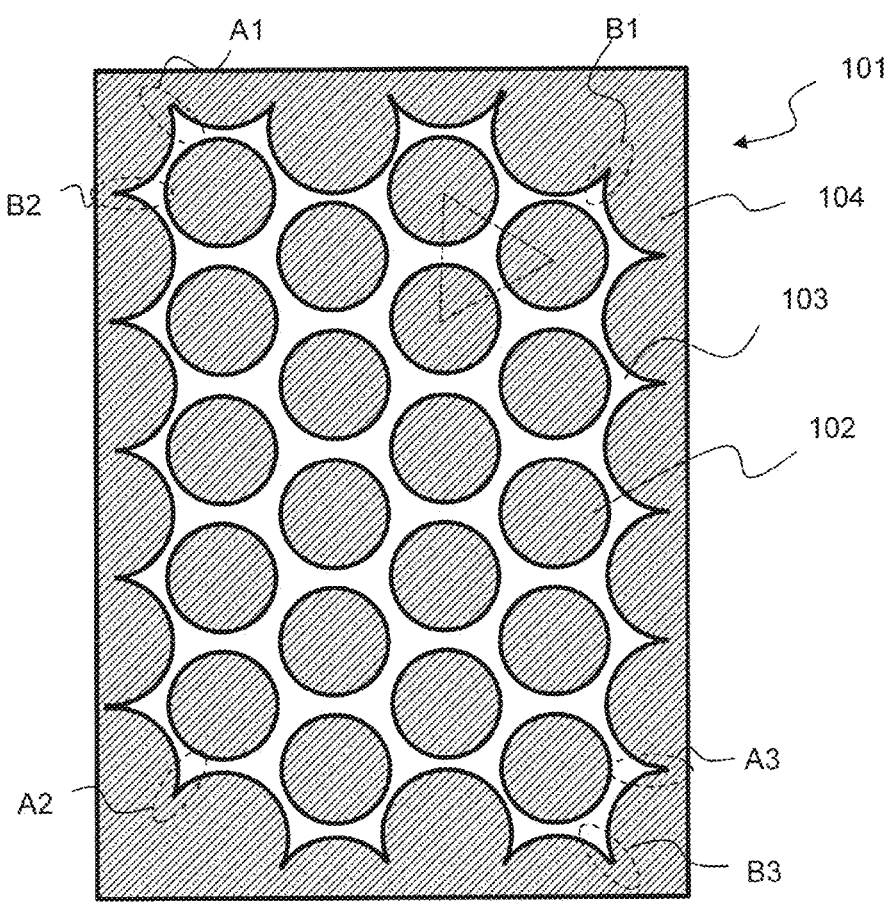
FIG. 3A is a schematic diagram of a pattern of an exposure mask used in the method of manufacturing a patterned substrate according to the present disclosure.

The step of providing the exposure mask and the step of exposing will be described in detail. FIG. 3A shows a pattern of a portion of an exposure mask 101, which is used in the step of exposing, to be irradiated with exposure light. In FIG. 3A, regions with hatching indicates light-shielding regions, and a region without hatching indicates a light-transmissive region. The exposure mask 101 has a rectangular shape in FIG. 3A, but the exposure mask 101 may have a square shape. The exposure mask 101 is also called "a reticle". In the method of manufacturing the patterned substrate according to the first embodiment, a positive photoresist is used in a photolithography process for forming the protruding portions 12.

The exposure mask 101 includes a plurality of inner light-shielding portions 102, a light-transmissive portion 103, and an outer light-shielding portion 104. Each of the inner light-shielding portions 102 corresponds to a shape of the bottom surface of a corresponding one of the protruding portions 12 of the patterned substrate 11. More specifically, each of the inner light-shielding portions 102 has a circular shape. For example, each of the inner light-shielding portions 102 has a circular shape with a diameter of 0.3 μm or greater and 5 μm or less.

The plurality of inner light-shielding portions 102 are arranged corresponding to an arrangement of the protruding portions 12 on the upper surface 11a of the patterned substrate 11. That is, in the exposure mask 101, the plurality of inner light-shielding portions 102 are arranged in a lattice. In the first embodiment, the inner light-shielding portions 102 are arranged in a triangular lattice, where the centers of adjacent three inner light-shielding portions 102 are located at vertexes of a regular triangle. As described above, the inner light-shielding portions 102 do not transmit exposure light.

The light-transmissive portion 103 is transmissive of exposure light, and integrally connects regions each surrounding a respective one of the plurality of inner light-shielding portions 102. That is, each of the inner light-shielding portions 102 is not connected to another one of the inner light-shielding portions 102, and is independent.

The outer light-shielding portion 104 surrounds the light-transmissive portion 103, and is not connected to any one of the plurality of inner light-shielding portions 102. The outer light-shielding portion 104 also does not transmit exposure light.

The exposure mask 101 can be formed by forming inner light-shielding portions 102 and the outer light-shielding portion 194, each of which is made of a light-shielding film such as a metal film, on a light-transmissive board such as glass that transmit exposure light.

Figure 3B:
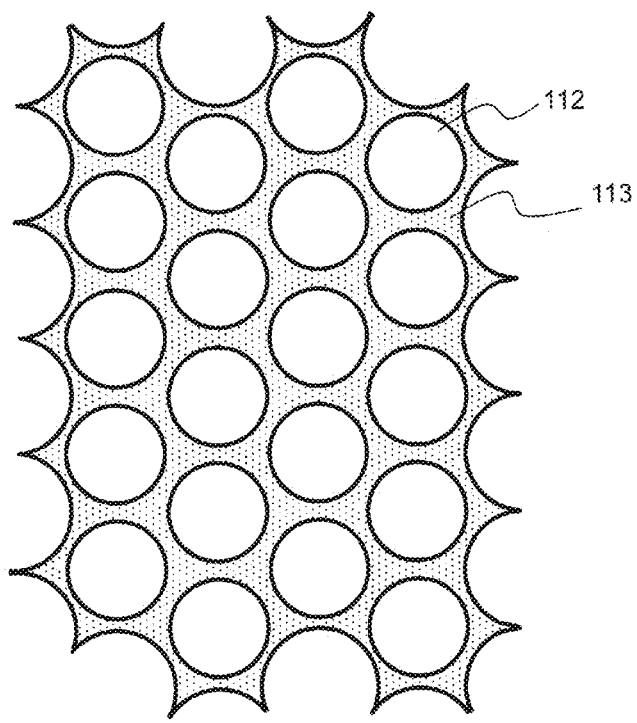
FIG. 3B is a schematic diagram showing a projected region of exposure light that has transmitted the exposure mask as shown in FIG. 3A.

FIG. 3B shows a projected region 113 of exposure light obtained by irradiating the exposure mask 101 with exposure light. The projected region 113 corresponds to the light-transmissive portion 103 of the exposure mask 101. The projected region 113 surrounds a plurality of inner projected parts 112, which corresponds to the plurality of inner light-shielding portions 102 of the exposure mask 101. The inner projected parts 112 is a region not irradiated with exposure light.

Figure 4:
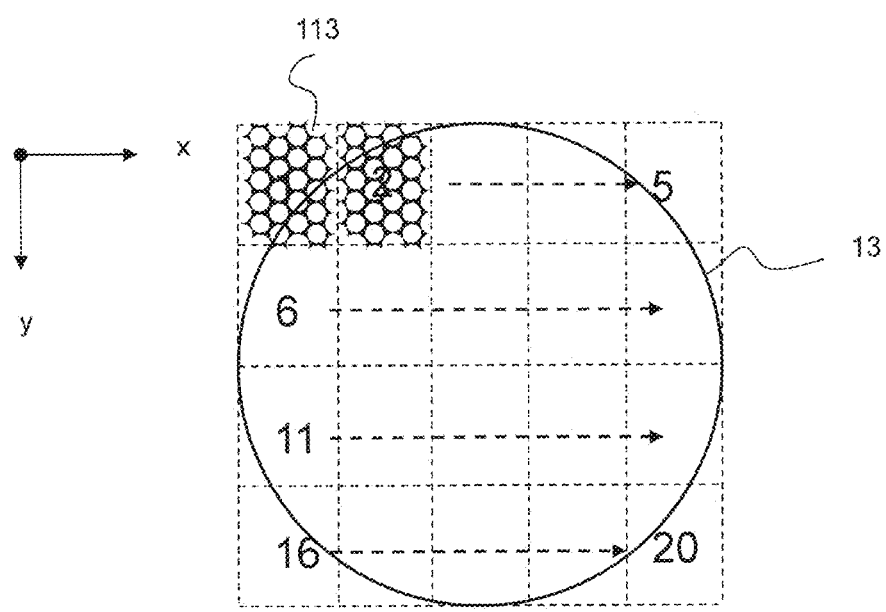
FIG. 4 is a schematic diagram showing an order of performing exposure in a step-and-repeat manner in the method of manufacturing a patterned substrate the present disclosure.

In the step of exposing, exposure light is reduction-projected onto the photoresist layer 14 on the substrate 13 using the exposure mask 101, and the photoresist layer 14 on the substrate 13 is exposed a plurality of times in a step-and-repeat manner. For example, as shown in FIG. 4, the substrate 13 is moved relatively in an x-direction and a y-direction with respect to the exposure mask 101 such that the projected regions 113 of exposure light is formed on the substrate 13 in order as indicated by 1, 2, . . . 20 in FIG. 4.

Figure 5A:
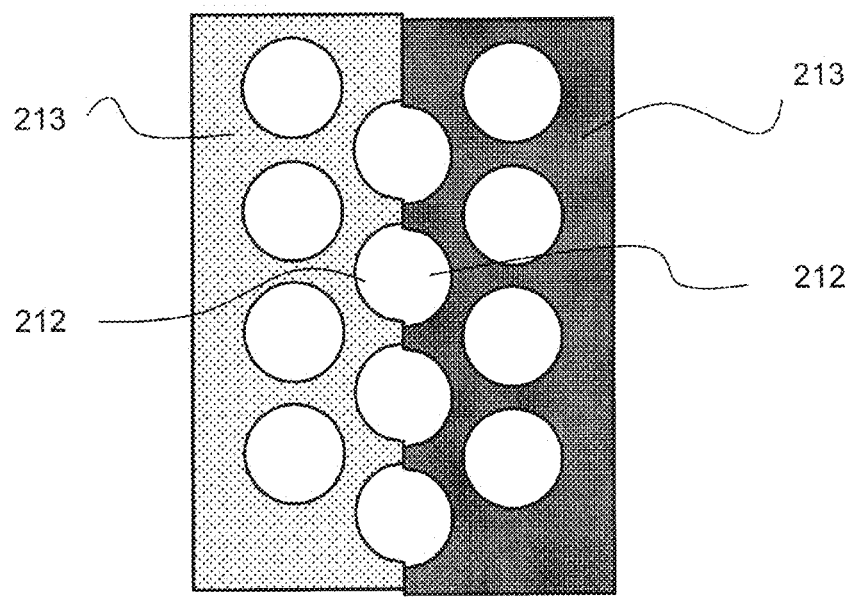
FIG. 5A is a schematic diagram for illustrating misalignment of projected regions due to alignment error of the exposure mask.

When the exposure is performed a plurality of times in such a step-and-repeat manner so as to join the projected regions to obtain a larger projected region, alignment accuracy and the like at joining portions between the projected regions should be controlled. As shown in FIG. 5A, when the inner projected parts 212 are located on a border between adjacent two of the projected regions 213, inaccurate alignment may result in deformation of two inner projected parts 212 joined together at the border.

Figure 5B:
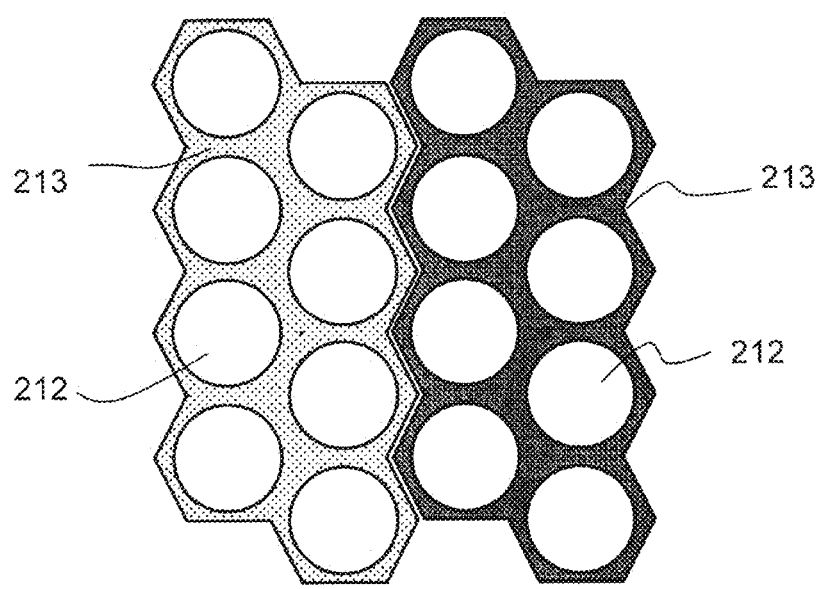
FIG. 5B is a schematic diagram for illustrating misalignment of projected regions due to alignment error of the exposure mask.

In order to avoid such deviation in the shape of the inner projected parts 212, an outermost periphery of the projected region may be surrounded by a region to be irradiated with exposure light. However, in this case, as shown in FIG. 5B, a gap may be generated between two adjacent projected regions 213 due to alignment error. The gap will become an unexposed region, which will remain between two adjacent projected regions 213.

Figure 5C:
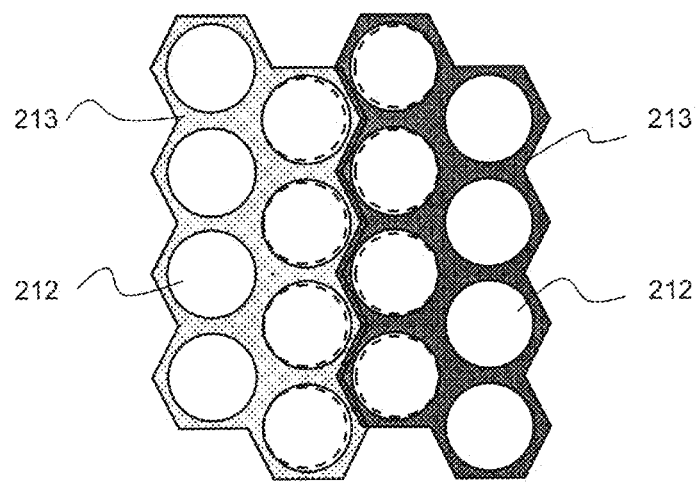
FIG. 5C is a schematic diagram for illustrating misalignment of projected regions due to alignment error of the exposure mask.

On the other hand, as shown in FIG. 5C, in view of alignment error, exposure may be performed so that two adjacent projected regions 213 slightly overlap each other. This may not generate an unexposed region, but an exposure amount at a portion where two exposed regions overlap may be excessive compared with an exposure amount at its surrounding portion, which may lead to reduction in size of a pattern of the inner projected parts 212 close to the portion where two exposed regions overlap.

When such exposure is performed and a developed photoresist layer is used as a mask in subsequent etching, a resulting patterned substrate may include deviation in shapes and/or positions of protruding portions in the pattern. Accordingly, when a semiconductor layer is epitaxially-grown in the patterned substrate, defects such as a pit or a void may be generated in the semiconductor layer starting from the protruding portions having deviated shapes and/or positions.

Figure 6A:
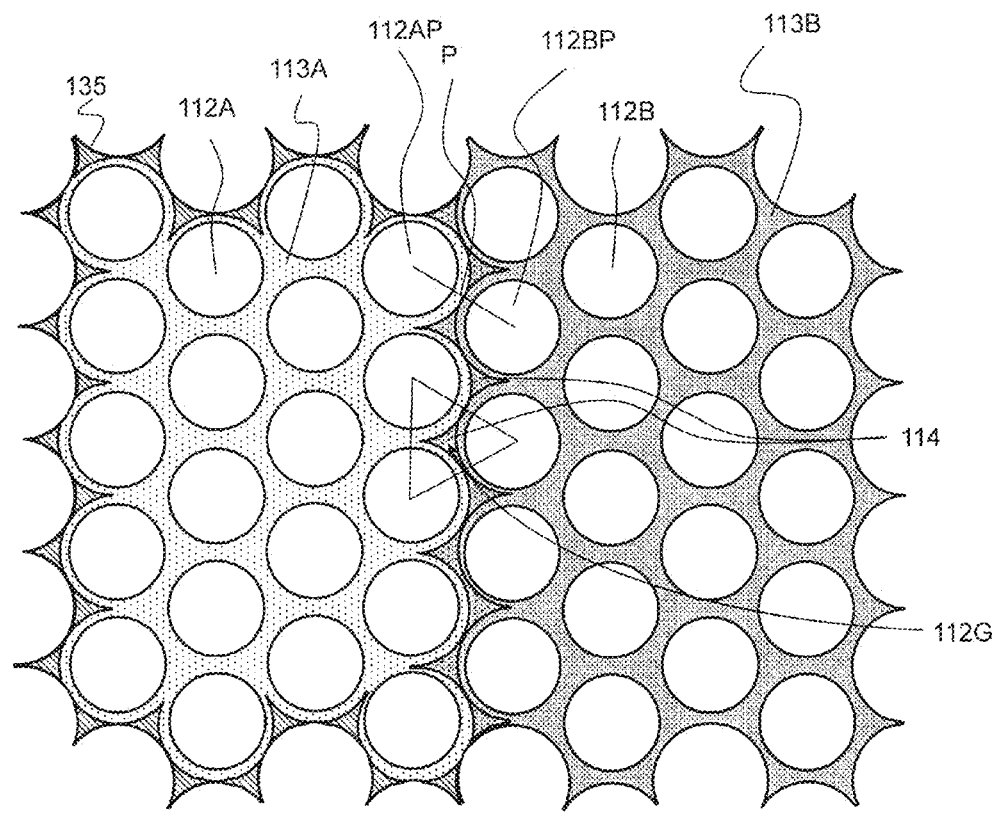
FIG. 6A is a schematic diagram showing projected regions in the case in which exposure is carried out a plurality of times using the exposure mask as shown in FIG. 3A.

In the step of providing the exposure mask and the step of exposing according to the present disclosure, in order to solve such a problem, a width of an overlapping region of two adjacent projected regions 113 at a border between two adjacent projected regions 113 is varied. FIG. 6A shows an arrangement of two adjacent projected regions 113A and 113B of exposure light. The projected region 113A indicates a region of exposure light projected by an exposure, e.g., the second exposure in FIG. 4. The projected region 113B indicates a region of exposure light projected in another exposure, e.g., the third exposure in FIG. 4. The projected region 113A and the projected region 113B form a larger projected region as an entirety, and the inner projected parts 112A and the inner projected parts 112B are arranged in a lattice as an entirety. While only two projected regions 113A and 113B are shown in FIG. 6A, other projected regions formed by other exposures forms a larger projected region as an entirety together with the projected regions 113A and 113B, and the larger projected region is projected on the photoresist layer 14 on the substrate 13. Further, the inner projected parts are arranged in a lattice as an entirety. As shown in FIG. 6A, the projected regions 113A formed by the second exposure and the projected regions 113B formed by the third exposure do not overlap with each other on a straight line P connecting one of inner projected parts 112AP, which are outermost ones of the plurality of inner projected parts 112A formed by the second exposure, and a corresponding one of inner projected parts 112BP, which are, of the plurality of inner projected parts 112B formed by the third exposure, inner projected parts located closest to the inner projected parts 112AP formed by the second exposure, at a shortest distance.

Meanwhile, at least a portion of the projected region 113A except for the straight line P and at least a portion of the projected region 113B except for the straight line P overlap each other. More specifically, each of overlapping regions 114 is located above a centroid 112G of a figure formed by connecting centers of three or four inner projected parts of the inner projected parts 112AP and 112BP. The three or four inner projected parts are selected from one or two of the inner projected parts 112AP, which are outermost ones of the plurality of inner projected parts 112A of the second exposure, and one or two of inner projected parts 112BP of the plurality of inner projected parts 112B of the third exposure. The overlapping regions 114 are regions where two or more projected regions overlap. In the first embodiment, the inner projected parts 112AP and 112BP are arranged in a triangular lattice, so that each of the overlapping regions 114 is located at the centroid 112G of a figure formed by connecting centers of three inner projected parts, which are a combination of respective two of the inner projected parts 112AP and a respective one of the inner projected parts 112BP or a combination of a respective one of the inner projected parts 112AP and respective two of the inner projected parts 112BP. In the first embodiment, each of the overlapping regions 114 has a substantially triangular shape.

With this arrangement, in two adjacent projected regions 113A and 113B of exposure light, exposed regions do not overlap with each other on the straight line P connecting the centers of each of the inner projected parts 112AP and a respective one of the inner projected parts 112BP, which are apart from each other with a short distance therebetween. Accordingly, leakage of exposure light to the inner projected parts 112AP or the inner projected parts 112BP from a projected region adjacent thereto due to excessive exposure amount can be reduced.

On the other hand, in a region except for the straight line P, the distance between each of the inner projected parts 112AP located at an outermost side of the projected region 113A and a respective one of the inner projected parts 112BP located at an outermost side of the projected region 113B is relatively increased. With this arrangement, even when a space is formed between the projected regions 113A and 113B due to alignment error, the projected regions 113A and 113B are partially overlapped and thus an unexposed portion is not formed therebetween, and meanwhile, even when the projected regions 113A and 113B are partially overlapped due to alignment error, because a relatively large distance is provided between the inner projected parts 112AP and the inner projected parts 112BP, which are outermost ones of the inner projected parts 112A and 112B, influence of increase in exposure amount can be reduced.

That is, according to the step of providing the exposure mask and the step of exposing in the present disclosure, overlapping regions of different widths are provided at a border between two adjacent projected regions. On the shortest straight lines connecting respective ones of the outermost inner projected parts of two adjacent projected regions, a width of overlapping regions between two adjacent projected regions is reduced, for example, so as not to create overlapping. Meanwhile, the location of the centroid of a figure formed by connecting the centers of three or four inner projected parts selected from outermost inner projected parts of two adjacent projected regions is the farthest from the selected three or four inner projected parts. Thus, the two adjacent projected regions are designed to overlap above the centroid.

With this arrangement, when a plurality of times of exposure is performed in a step-and-repeat manner to join the projected regions to form a larger projected region, occurrence of excess or deficiency of exposure light at a border between the projected regions can be reduced. Thus, in a photoresist layer formed by the exposure, distortion in the obtained pattern at a border between the projected regions can be reduced. Accordingly, in a patterned substrate manufactured using the photoresist layer in which distortion in the pattern is reduced, distortion in the shapes of the protruding portions and positional error of the protruding portions can be reduced. Thus, manufacturing a semiconductor light emitting device with the use of the patterned substrate according to the present disclosure allows for a reduction in generation of pits, voids, or the like in a semiconductor layer, so that a semiconductor light emitting device with reduced defects can be produced at a high yield.

Figure 6B:
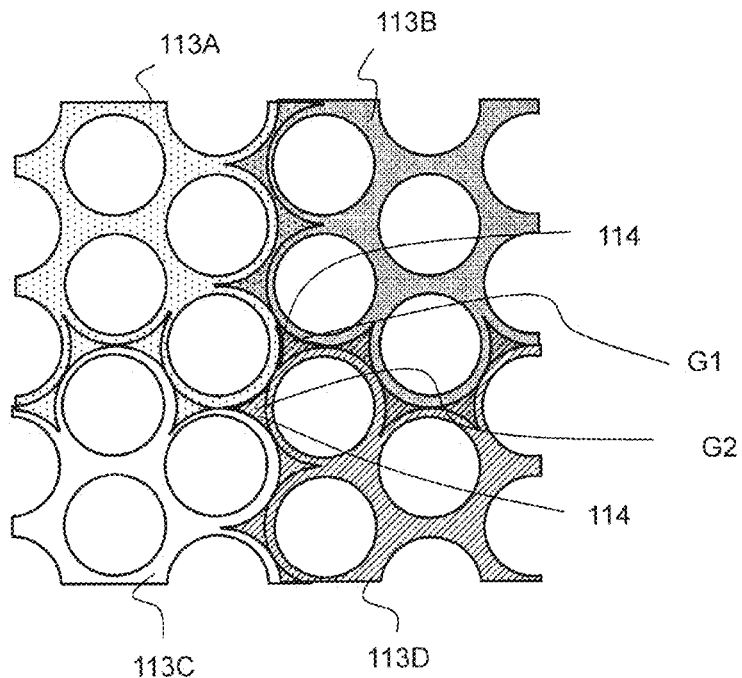
FIG. 6B is another schematic diagram showing projected regions in the case in which exposure is carried out a plurality of times using the exposure mask as shown in FIG. 3A.
Figure 6C:
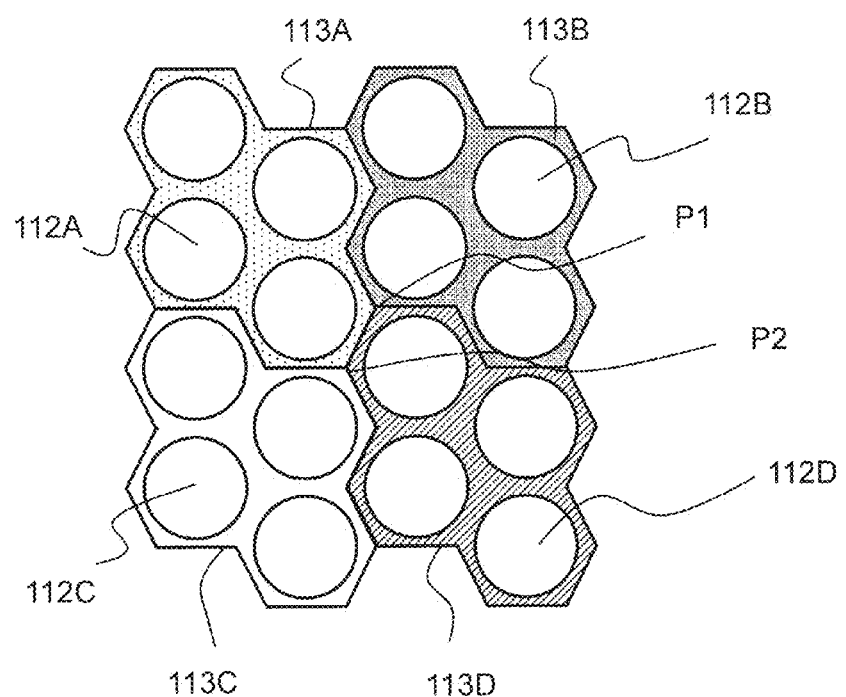
FIG. 6C is a schematic diagram for illustrating the projected regions shown in FIG. 6B.

FIG. 6A illustrates two projected regions 113A and 113B obtained by two exposure light. When other projected regions are arranged on a left side, an upper side, and a lower side of the projected region 113A in FIG. 6A, regions 135 indicated by hatchings in FIG. 6A overlap with other projected regions. That is, the regions 135 will serve as overlapping regions. The overlapping regions 114 and the regions 135 have a same shape in design. However, in an exposure operation, overlapping of two adjacent projected regions may be deviated to an allowable extent, and thus shapes of the overlapping regions 114 and shapes of the regions 135 of corners of each of the projected regions may not completely correspond to each other. FIG. 6B is an enlarged view of vicinity of a region, illustrating an arrangement of corner portions of four projected regions 113A, 113B, 113C, and 113D that are obtained by exposures. FIG. 6C is a diagram schematically showing an arrangement of the four projected regions 113A, 113B, 113C, and 113D except for the overlapping regions 114. For ease of understanding, corresponding parts or regions in FIG. 6B and FIG. 6C are denoted by the same reference numerals.

In the present embodiment, the inner projected parts 112 are arranged in a triangular lattice. Accordingly, the four projected regions 113A, 113B, 113C, and 113D do not meet at a single point. In FIG. 6B and FIG. 6C, the projected region 113B and the projected region 113C are not in contact with each other, and do not overlap with each other. As shown in FIG. 6C, the projected regions 113A, 113B, 113D share a point P1, and the projected regions 113A, 113C, and 113D share a point P2. Accordingly, as shown in FIG. 6B, at the point P1, which corresponds to a centroid G1 of a triangle in the triangular lattice, the projected regions 113A, 113B, and 113D overlap at a single overlapping region 114. Also, at the point P2, which corresponds to a centroid G2 of a triangle in the triangular lattice, the projected regions 113A, 113C, and 113D overlap at a single overlapping region 114. At other borders, two projected regions overlap. As described above, in the vicinity of the region where corners of four projected regions 113A, 113B, 113C, and 114D are arranged, if an excessive exposure is caused due to overlapping of three of the projected regions, the exposure mask may be modified so that only two of the projected regions overlap. In the exposure mask 101 shown in FIG. 3A, a light-shielding portion of a shape corresponding to the overlapping region 114 shown in FIG. 6A may be connected to the outer light-shielding portion 104 at one of three regions indicated by A1 to A3 in the light-transmissive portion 103 to shield the region from exposure. Alternatively, a light-shielding portion of a shape corresponding to the overlapping region 114 shown in FIG. 6A may be connected to the outer light-shielding portion 104 at one of three regions indicated by B1 to B3 in the light-transmissive portion 103 to shield the region from exposure. Such modification of the light-transmissive portion 103 creates a portion where overlapping of light-transmitted regions does not occur, at a portion other than portions where corners of four projected regions meet. For example, when a region A1 of the light-transmissive portion 103 is shielded, overlapping of projected regions at the region A1 shown in FIG. 3A does not occur in the projected regions of sixth, eleventh, and sixteenth exposure. However, such portions in these exposures are located at periphery of an entirety of the exposed regions, and thus their projection may not be on the substrate 13 or may be at a periphery of the substrate 13 that is not used for forming a semiconductor light emitting element. Accordingly, with consideration of the arrangement of the light emitting device to be formed on the substrate 13 and the arrangement of the projected regions with respect to the substrate 13, unfavorable effects of a position where overlapping of the projected regions does not occur can be avoided or reduced.

Other Examples of Exposure Mask

Figure 7A:
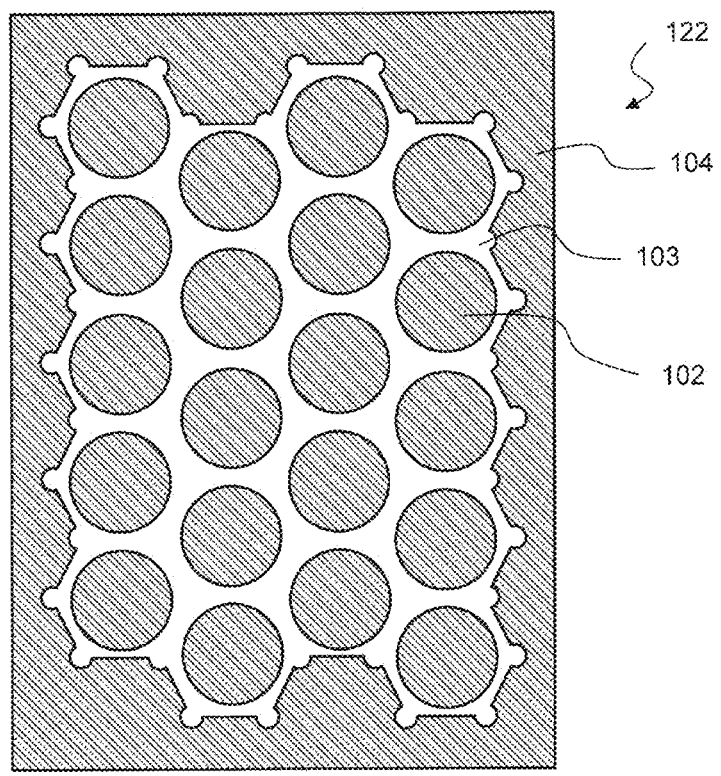
FIG. 7A is a schematic diagram of a pattern of another exposure mask used in the method of manufacturing a patterned substrate according to the present disclosure.
Figure 7B:
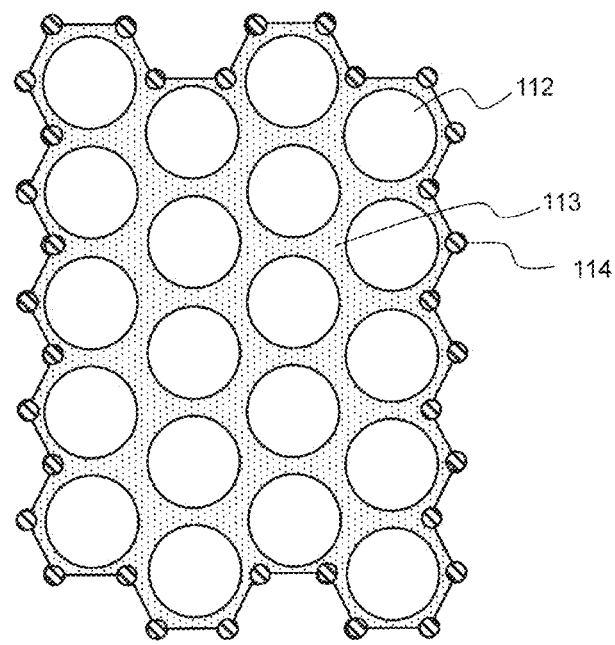
FIG. 7B is a schematic diagram showing a projected region of exposure light that has transmitted the exposure mask as shown in FIG. 7A.
Figure 8:
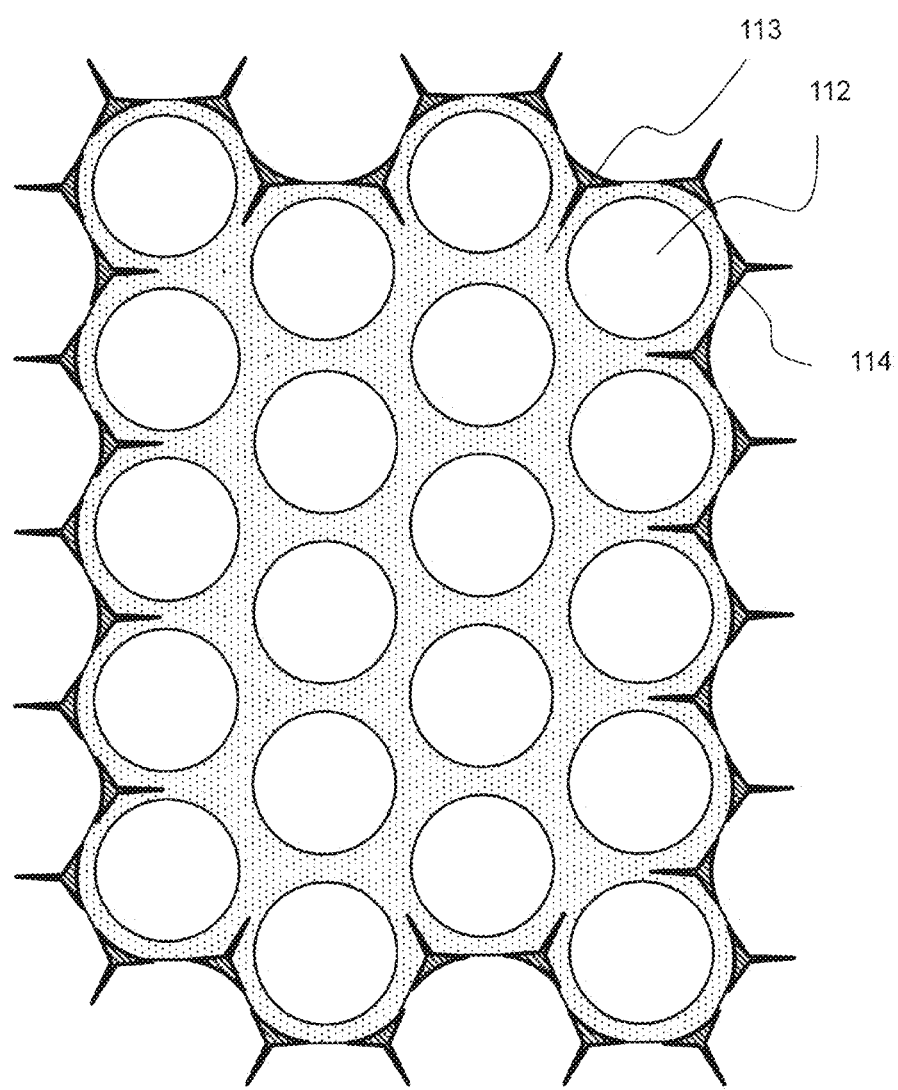
FIG. 8 is a schematic diagram showing a projected region of exposure light that has transmitted another exposure mask used in the method of manufacturing a patterned substrate according to the present disclosure.
Figure 9:
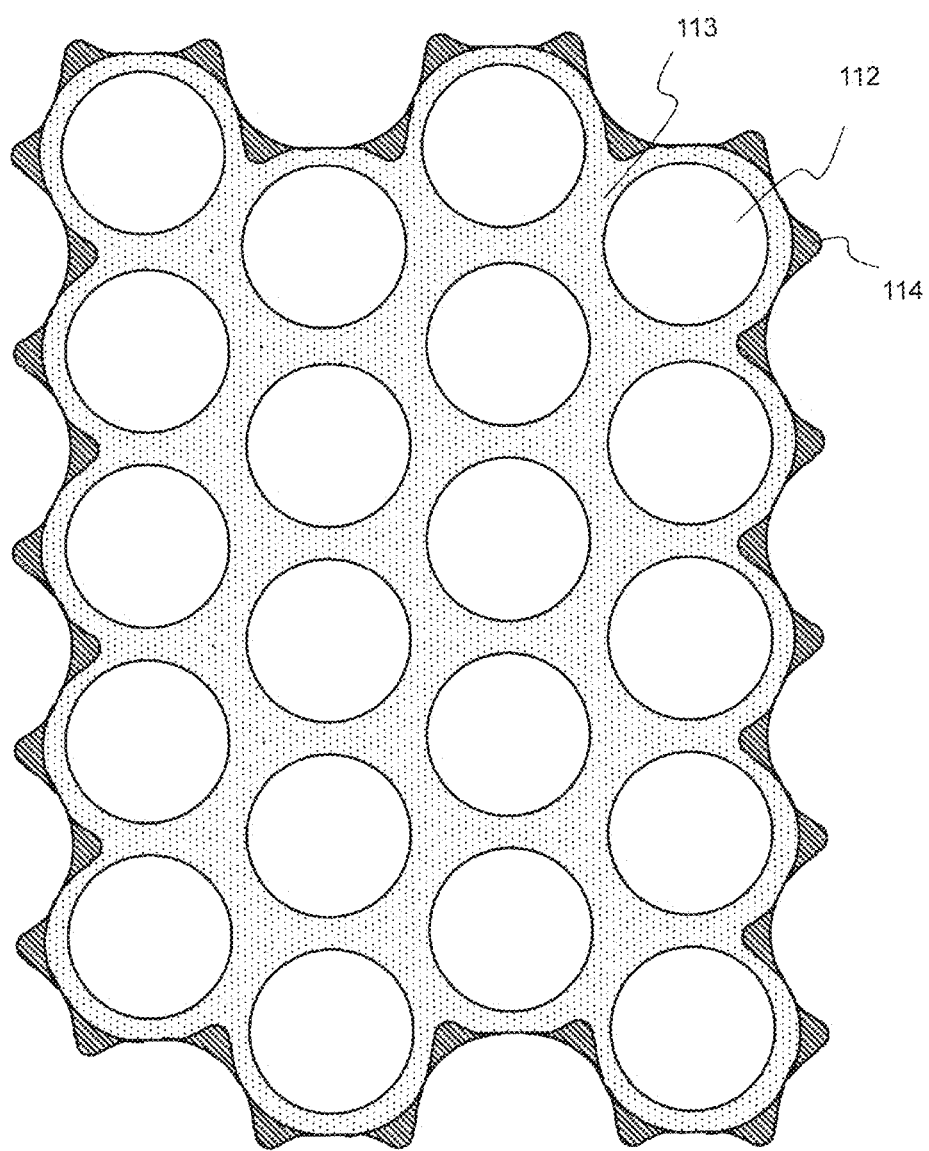
FIG. 9 is a schematic diagram showing a projected region of exposure light that has transmitted even another exposure mask used in the method of manufacturing a patterned substrate according to the present disclosure.

The shape of the overlapping regions 114, where two or more projected regions due to different exposures overlap, is not limited to an approximately triangular shape, and another appropriate shape can be employed. FIG. 7A shows a plan view of an exposure mask 122 to form overlapping regions 114 in an approximately circular shape, and FIG. 7B shows a projected region 113 obtained by transmitting exposure light through the exposure mask 122. Fan-like shaped recesses are defined at corners of an inner periphery of an outer light-shielding portion 104 of the exposure mask 122. Corresponding to the shape of the outer light-shielding portion 104, the outer periphery of the projected region 113 includes a circular arc-like shaped region at each corner. Accordingly, when a plurality of times of exposures are performed in a step-and-repeat manner so as to join the projected regions to form a greater projected region, overlapping regions 114 of a circular shape are formed at a border between two adjacent projected regions 113, as shown in FIG. 7B. As described in the first embodiment, each of the overlapping regions 114 is located above the centroid of a figure formed by connecting the centers of adjacent three or four outermost inner projected parts selected from two adjacent projected regions. Because the shape of the light-transmissive portion of the exposure mask and the shape of the projected region are in conformity to each other, the overlapping regions 114 will be illustrated below referring to the projected regions. As shown in FIG. 8, the overlapping regions 114 may have a substantially pentagonal shape. As shown in FIG. 9, the overlapping regions 114 may have a mountain-like shape.

Figure 10:
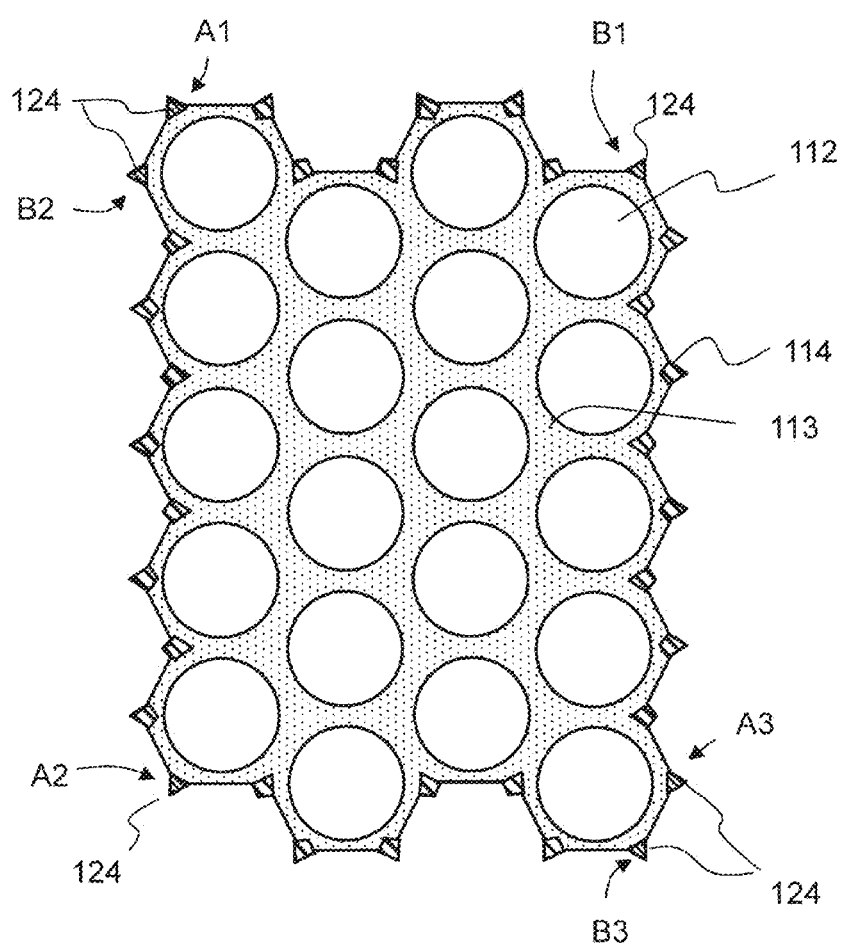
FIG. 10 is a schematic diagram showing a projected region of exposure light that has transmitted still another exposure mask used in the method of manufacturing a patterned substrate according to the present disclosure.

In the examples illustrated above, the overlapping regions 114, which are formed by overlapping one projected region 113 and its adjacent projected region 113, are located at corners of each of the projected regions 113 and have a same shape. But different shapes of the overlapping regions may be employed for certain locations. In an example shown in FIG. 10, when projected regions 113 are joined to each other, among corners of the projected regions 113, a shape of an overlapping region at a corner where three projected regions overlap and a shape of an overlapping region at a corner where two projected regions overlap are different from each other. More specifically, in FIG. 10, at the corners of the periphery of the projected regions 113, each of the overlapping regions 124 at the corners indicated by A1 to A3 and B1 to B3 has a triangular shape similar to that in FIG. 3A, and each of the overlapping regions 114 at the other corners has a tetragonal shape. Further, each of the overlapping regions 124 has an area smaller than an area of each of the overlapping regions 114. With this configuration, each of the overlapping regions 124 at the corners where three projected regions overlap has an area smaller than an area of each of the overlapping regions 114 at the corners where two projected regions overlap, so that an excessive amount of exposure can be avoided.

Figure 11:
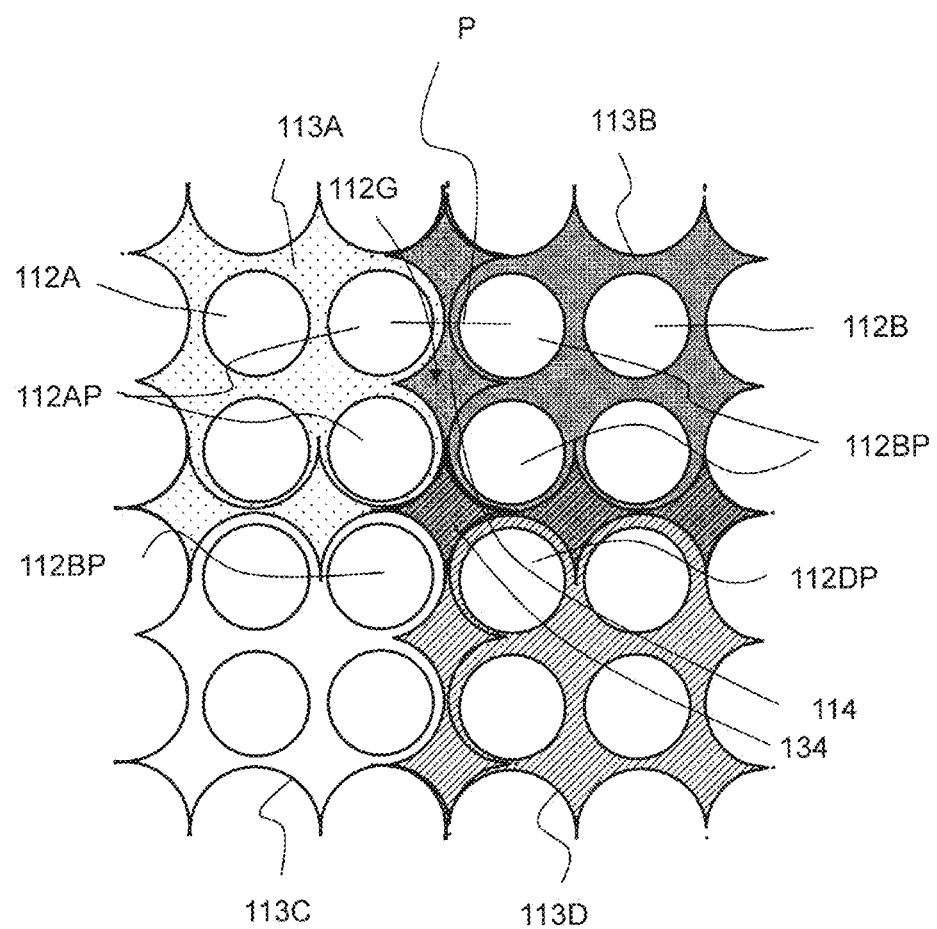
FIG. 11 is a schematic diagram showing projected regions in the case in which exposure is carried out a plurality of times using further another exposure mask used in the method of manufacturing a patterned substrate according to the present disclosure.

Further, in the embodiment described above, the protruding portions 12 on the upper surface 11a of the patterned substrate 11 are arranged in a triangular lattice, but it is possible to manufacture the patterned substrate 11 in which the protruding portions 12 are arranged in a quadrangular lattice. In this case, the inner projected parts 112 at an inner side of a projected region are also arranged in a quadrangular lattice. FIG. 11 illustrates a corner portion where the projected regions 113A, 113B, 113C, and 113D are connected, with which inner projected parts are arranged in a quadrangular lattice.

The projected region 113A and the projected region 113B do not overlap with each other on shortest straight lines P respectively connecting the inner projected parts 112AP, which are outermost ones of the plurality of inner projected parts 112A formed by an exposure light, and a corresponding one of inner projected parts 112BP, which are of the inner projected parts 112B formed by another exposure light, and are located closest to the inner projected parts 112AP. Meanwhile, an overlapping region 114 is located above the centroid 112G of a figure obtained by connecting centers of two of the inner projected parts 112AP, which are located at an outermost side of the projected region 113A, and centers of two of the inner projected parts 112 located at an outermost side of the projected region 113B. Other overlapping regions 114 are arranged between the projected regions 113A and 113C and between the projected region 113B and 113D with a positional relationship similar to that of the overlapping region 114 between the projected region 113A and 113B. Further, an overlapping region 134 is located above the centroid of a figure obtained by connecting the centers of the inner projected parts 112AP, 112BP, 112CP, and 112DP, which are located at a cornermost side of the projected regions 113A, 113B, 113C, and 113D, respectively. Portions of the projected regions 113A, 113, 113C, and 113D overlap one another above the overlapping region 134. Also in the case in which the inner projected parts are arranged in a quadrangular lattice, exposed regions do not overlap with each other on the straight line P connecting the inner projected parts 112AP and 112BP with a short distance therebetween. Accordingly, leakage of exposure light to the inner projected part 112AP or the inner projected part 112BP from its adjacent region due to excessive exposure amount can be reduced. Further, on a region except for a region on the straight line P, the overlapping regions 114 are formed, so that a sufficient exposure amount can be secured even if alignment error occurs. Even further, each of the overlapping regions 114 is located between a respective one of the inner projected parts 112AP and a respective one of the inner projected parts 112BP such that a distance between each of the overlapping regions 114 and a respective one of the inner projected parts 112AP or a respective one of the inner projected parts 112BP is not the shortest. Accordingly, even in the case in which inner projected parts in each of projected regions are arranged in a quadrangular lattice, excess or scarce of exposure light at a border between the projected regions can be reduced, so that distortion of a pattern in a photoresist layer formed by exposure can be reduced at a border between the projected regions of exposure light.

Second Embodiment

A method of manufacturing a semiconductor light emitting device according to a second embodiment of the present disclosure will be described below with reference to FIGS. 12A to 12D.

Manufacturing Patterned Substrate

Figure 12A:
FIG. 12A is a schematic cross-sectional view illustrating a step in the method of manufacturing a semiconductor light emitting device according to the present disclosure.

A patterned substrate 11 having protruding portions 12 arranged on an upper surface 11a thereof is produced according to the first embodiment (FIG. 12A). The patterned substrate 11 is produced, for example, using a sapphire substrate, and in the manner described with respect to the first embodiment.

Forming Semiconductor Layered Structure

Figure 12B:
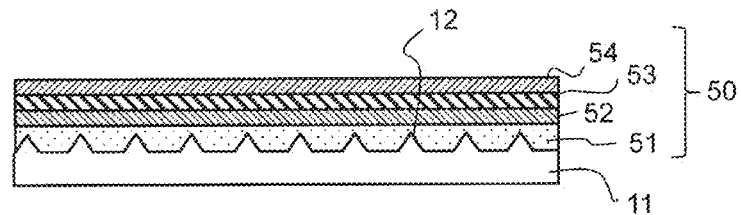
FIG. 12B is a schematic cross-sectional view illustrating a step in the method of manufacturing a semiconductor light emitting device according to the present disclosure.

A semiconductor layered structure 50 is formed on the patterned substrate 11 (FIG. 12B).

For example, an underlayer 51, an n-type semiconductor layer 52, a light emitting layer 53, and a p-type semiconductor layer 54 are grown in order on the patterned substrate 11 using an epitaxial growing method such as a metal organic chemical vapor deposition (MOCVD) method or a molecular beam epitaxy (MBE) method. The underlayer 51 is grown to fill the space between the protruding portions and to form a flat upper surface.

Forming Electrode

Figure 12C:
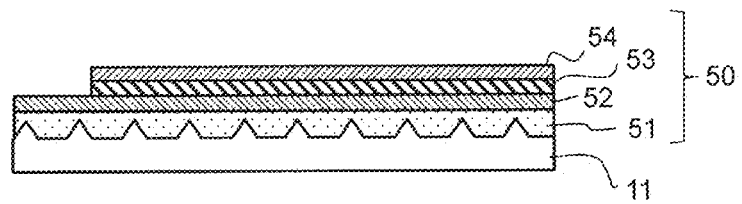
FIG. 12C is a schematic cross-sectional view illustrating a step in the method of manufacturing a semiconductor light emitting device according to the present disclosure.
Figure 12D:
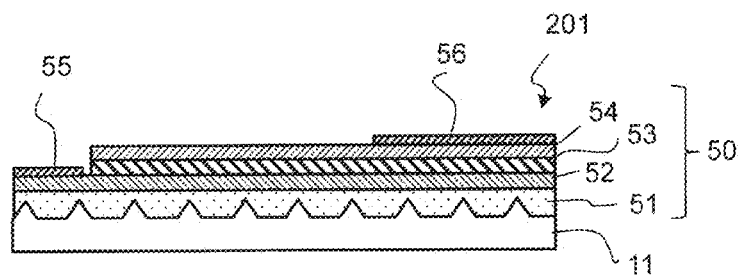
FIG. 12D is a schematic cross-sectional view illustrating a step in a method of manufacturing a semiconductor light emitting device according to the present disclosure.

After forming the semiconductor layered structure 50, the p-type semiconductor layer 54 and the light emitting layer 53 are partially removed by using an etching technique to expose a portion of the n-type semiconductor layer 52 (FIG. 12C). Then, an n-side electrode 55 and a p-side electrode 56 are formed on the exposed portion of the n-type semiconductor layer 52 and the p-type semiconductor layer 54, respectively (FIG. 12D).

Subsequently, the patterned substrate 11 and these structures formed thereon are singulated to obtain individual semiconductor light emitting devices 201. FIG. 12A to 12D illustrates a portion corresponding to a single semiconductor light emitting device.

According to a method of manufacturing a semiconductor light emitting device of the present disclosure, a semiconductor light emitting device is manufactured with the use of the patterned substrate 11 in which distortion of the shapes of the protruding portions and positional error of the protruding portions are reduced, so that generation of a pit or a void in the semiconductor layered structure can be reduced. Accordingly, a semiconductor light emitting device in which defects are reduced can be manufactured at a high yield.

EXAMPLES

Figure 13A:
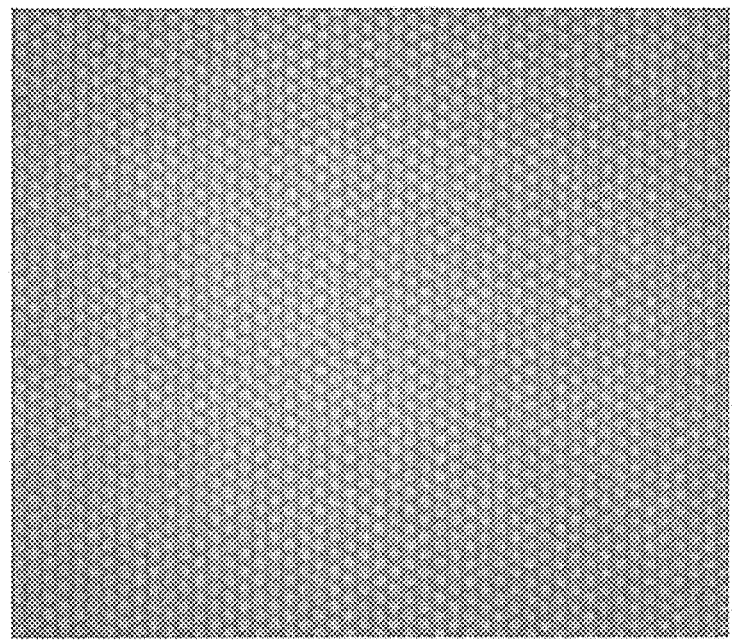
FIG. 13A is a diagram illustrating an example of a developed state of an upper surface of a photoresist layer that has been exposed using the exposure mask shown in FIG. 7A and developed.
Figure 13B:
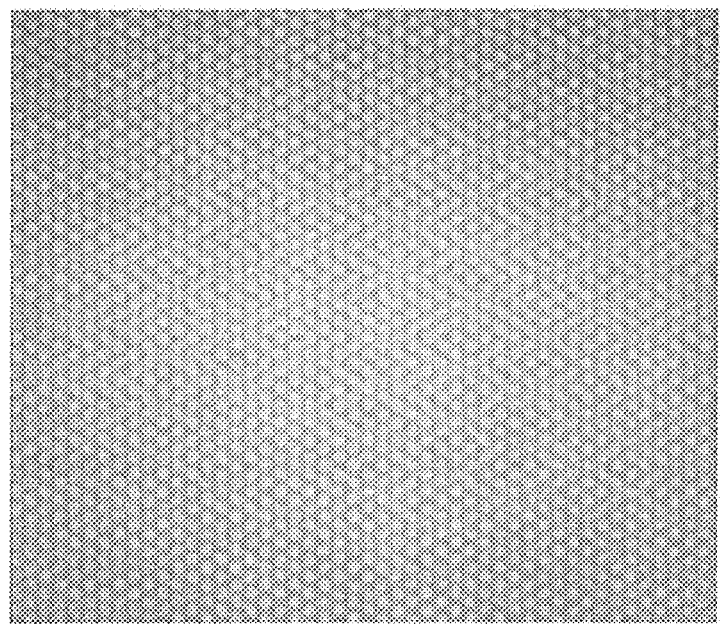
FIG. 13B is a diagram illustrating an example of a developed state of an upper surface of a photoresist layer that has been exposed using the exposure mask shown in FIG. 3A and developed.

An example of a result of observation of a photoresist layer that has been exposed and developed in a method as described in the first embodiment will be illustrated below. FIG. 13A and FIG. 13B are diagrams illustrating examples of developed states of the upper surfaces of photoresist layers respectively formed by using the exposure masks shown in FIG. 7A and FIG. 3A. For comparison, FIG. 14A and FIG. 14B illustrate examples of developed states of the upper surfaces of photoresist layers respectively formed by using conventional exposure masks with alignments of projected regions shown in FIG. 5B and FIG. 5C.

In FIG. 13A and FIG. 13B, little distorted portion is observed in the circular pattern for forming the protruding portions, and any noticeable distortion in the pattern is not observed at locations corresponding to joint portions (i.e., borders) between the projected regions.

Figure 14A:
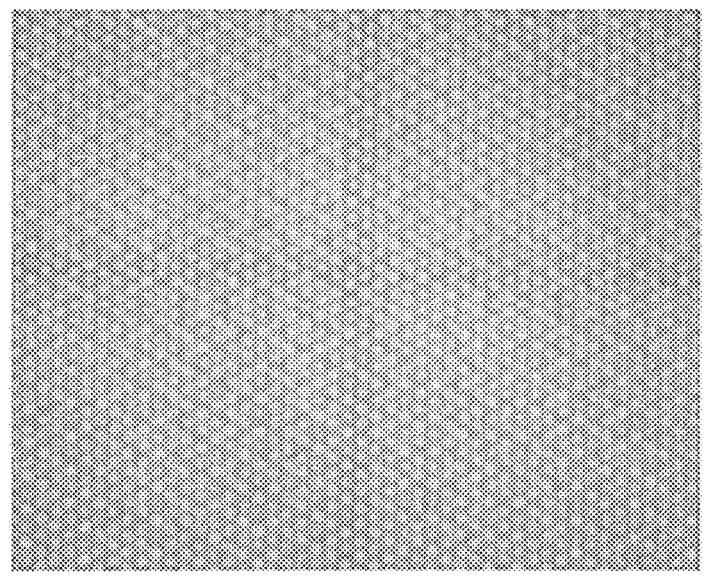
FIG. 14A is a diagram illustrating an example of a developed state of an upper surface of a photoresist layer that has been exposed using a conventional exposure mask with an alignment of the projected regions as shown in FIG. 5B and developed.
Figure 14B:
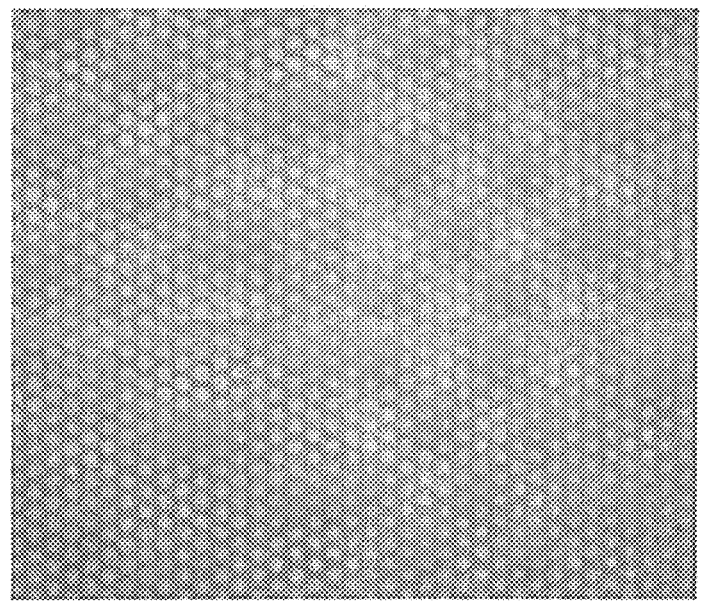
FIG. 14B is a diagram illustrating an example of a developed state of an upper surface of a photoresist layer that has been exposed using a conventional exposure mask with an alignment of the projected regions as shown in FIG. 5C and developed.

In contrast, when a space is present at the joint portion between projected regions, dark shadows occur at locations corresponding to the joint portions (i.e., borders) between the projected regions as shown in FIG. 14A. The dark shadows are thought to be caused by a portion of the photoresist left at the location due to insufficient amount of exposure. Meanwhile, when the projected regions are overlapped along the joint portions between projected patterns, whitish stripes are observed at locations corresponding to the joint portions (i.e., borders) between the projected regions. The whitish stripes are thought to be caused by reduction in size of the circular pattern due to an excessive amount of exposure.

As described above, it was confirmed that a photoresist layer having a uniform pattern on an upper surface thereof can be formed by using the method of manufacturing the patterned substrate according to the present disclosure.

The method of manufacturing the patterned substrate according to the present disclosure can be suitably used for manufacturing of a semiconductor device such as a light emitting device, and a photonic device. Further, the method of manufacturing the semiconductor light emitting device according to the present disclosure can be suitably used for manufacturing of a semiconductor light emitting device that can be used for a light source for various kinds of use.

It is to be understood that although the present invention has been described with regard to certain embodiments thereof, various other embodiments and variants may occur to those skilled in the art, which are within the scope and spirit of the invention, and such other embodiments and variants are intended to be covered by the following claims.

What is claimed is:

1. A method of manufacturing a patterned substrate, the method comprising:
    providing an exposure mask, the exposure mask comprising:
        a plurality of inner light-shielding portions arranged in a lattice,
        a light-transmissive portion integrally connecting regions surrounding the plurality of inner light-shielding portions, and
        an outer light-shielding portion surrounding the light-transmissive portion;
    performing a plurality of exposures of a photoresist layer disposed on a substrate in a step-and-repeat-manner using the exposure mask, so as to form a plurality of inner projected parts corresponding to the inner light-shielding portions, the inner projected parts being aligned in a lattice as a whole;
    developing the photoresist layer on which the plurality of exposures have been performed; and
    etching the substrate using the developed photoresist layer as a mask;
    wherein, in the step of performing the plurality of exposures:
        (i) a first region that corresponds to the light-transmissive portion and that is formed by a predetermined one of the plurality of exposures and (ii) a second region that corresponds to the light-transmissive portion and that is formed by a predetermined other one of the plurality of exposures do not overlap each other on shortest straight lines each connecting one of a plurality of outermost inner projected parts formed by the predetermined one of the plurality of exposures and one of a plurality of inner projected parts formed by the predetermined other one of the plurality of exposures that is located closest to said one of the plurality of outermost inner projected parts, and
        (i) portions of the first region, and (ii) portions of the second region, overlap each other in places other than the shortest straight lines.

2. The method of manufacturing the patterned substrate according to claim 1, wherein, the portions that overlap each other are located above a centroid of a figure formed by connecting centers of three or four inner projected parts of the plurality of inner projected parts, which are selected from outermost one or two inner projected parts of the plurality of inner projected parts of the predetermined one of the plurality of exposures and one or two inner projected parts of the plurality of inner projected parts of the predetermined other one of the plurality of exposures respectively located closest to the outermost one or two inner projected parts of the plurality of inner projected parts of the predetermined one of the plurality of exposures.

3. The method of manufacturing the patterned substrate according to claim 2, wherein the plurality of inner light-shielding portions are arranged in a triangular lattice.

4. The method of manufacturing the patterned substrate according to claim 3, wherein each of the plurality of inner light-shielding portions has a circular shape.

5. A method of manufacturing a semiconductor light emitting device, the method comprising:
    manufacturing a patterned substrate using the method according to claim 4;
    forming a semiconductor layered structure on the patterned substrate, the semiconductor layered structure including a light-emitting layer; and forming an n-side electrode and a p-side electrode that are electrically connected to the semiconductor layered structure.

6. A method of manufacturing a semiconductor light emitting device, the method comprising:
manufacturing a patterned substrate using the method according to claim 3;
forming a semiconductor layered structure on the patterned substrate, the semiconductor layered structure including a light-emitting layer; and
forming an n-side electrode and a p-side electrode that are electrically connected to the semiconductor layered structure.

7. The method of manufacturing the light patterned substrate according to claim 2, wherein the portions that overlap each other have a circular shape.

8. The method of manufacturing the patterned substrate according to claim 2, wherein each of the plurality of inner light-shielding portions has a circular shape.

9. A method of manufacturing a semiconductor light emitting device, the method comprising:
manufacturing a patterned substrate using the method according to claim 2;
forming a semiconductor layered structure on the patterned substrate, the semiconductor layered structure including a light-emitting layer; and
forming an n-side electrode and a p-side electrode that are electrically connected to the semiconductor layered structure.

10. The method of manufacturing the patterned substrate according to claim 1, wherein the plurality of inner light-shielding portions are arranged in a triangular lattice.

11. The method of manufacturing the light patterned substrate according to claim 10, wherein the portions that overlap each other have a circular shape.

12. The method of manufacturing the patterned substrate according to claim 10, wherein each of the plurality of inner light-shielding portions has a circular shape.

13. The method of manufacturing the light patterned substrate according to claim 1, wherein the portions that overlap each other have a circular shape.

14. The method of manufacturing the patterned substrate according to claim 13, wherein each of the plurality of inner light-shielding portions has a circular shape.

15. The method of manufacturing the patterned substrate according to claim 1, wherein the portions that overlap each other have a substantially triangular shape.

16. The method of manufacturing the patterned substrate according to claim 1, wherein each of the plurality of inner light-shielding portions has a circular shape.

17. The method of manufacturing the patterned substrate according to claim 16, wherein each of the plurality of inner light-shielding portions has a diameter in a range of 0.3 µm to 5 µm.

18. The method of manufacturing the patterned substrate according to claim 16, wherein a distance between centers of adjacent inner light-shielding portions of the plurality of inner light-shielding portions is in a range of 0.4 µm to 6 µm.

19. The method of manufacturing the patterned substrate according to claim 1, wherein the substrate is a sapphire substrate.

20. A method of manufacturing a semiconductor light emitting device, the method comprising:
manufacturing a patterned substrate using the method according to claim 1;
forming a semiconductor layered structure on the patterned substrate, the semiconductor layered structure including a light-emitting layer; and
forming an n-side electrode and a p-side electrode that are electrically connected to the semiconductor layered structure.

* * * * *